United States Patent [19]

Whitehouse et al.

[11] 4,068,311
[45] Jan. 10, 1978

[54] DISCRETE TRANSFORM SYSTEMS USING PERMUTER MEMORIES

[75] Inventors: Harper J. Whitehouse; Jeffrey M. Speiser, both of San Diego, Calif.

[73] Assignee: The United States of America as represented by the Secretary of the Navy, Washington, D.C.

[21] Appl. No.: 747,148

[22] Filed: Dec. 3, 1976

[51] Int. Cl.² ............... G06G 7/12; G06G 7/19
[52] U.S. Cl. .................... 364/827; 307/221 D; 328/167; 333/70 T; 364/825; 364/862
[58] Field of Search ............... 235/193, 181, 156, 152, 235/186; 307/221 D; 328/167; 333/18, 28 R, 70 T; 357/24; 358/133, 138

[56] References Cited

U.S. PATENT DOCUMENTS

| | | | |
|---|---|---|---|
| 3,920,974 | 11/1975 | Means | 235/152 |
| 3,925,648 | 12/1975 | Speiser et al. | 235/156 |
| 3,926,367 | 12/1975 | Bond et al. | 235/156 X |
| 3,942,035 | 3/1976 | Buss | 307/221 D |
| 3,971,927 | 7/1976 | Speiser et al. | 235/156 X |

*Primary Examiner*—Joseph F. Ruggiero
*Attorney, Agent, or Firm*—Richard S. Sciascia; Ervin F. Johnston; John Stan

[57] ABSTRACT

High-speed, high-accuracy, apparatus for performing discrete Fourier and discrete cosine transforms, suitable for signal processing applications. The apparatus includes a means for switching an input signal from a sample-and-hold circuit to a circuit which includes an integrator in cascade with an amplifier. The outputs of these two circuits are summed in a first summer to give one term, $G_0$, which is proportional to the d-c component of the input signal. In parallel with the integrator and amplifier is a cascade circuit comprising a first permuter, a filter and a second permuter. A permuter is a special type of memory. The outputs of the sample-and-hold circuit and of the second permuter are summed in a second summer, to result in an output comprising the other transformed terms, $G_1, \ldots, G_{N-1}$.

7 Claims, 2 Drawing Figures

NOTE: THE SWITCH IS IN THE UP POSITION FOR THE FIRST DATA SAMPLE, AND IS DOWN FOR THE REMAINING N-1 SAMPLES.

APPARATUS FOR PERFORMING A DISCRETE FOURIER OR ODD COSINE TRANSFORM.

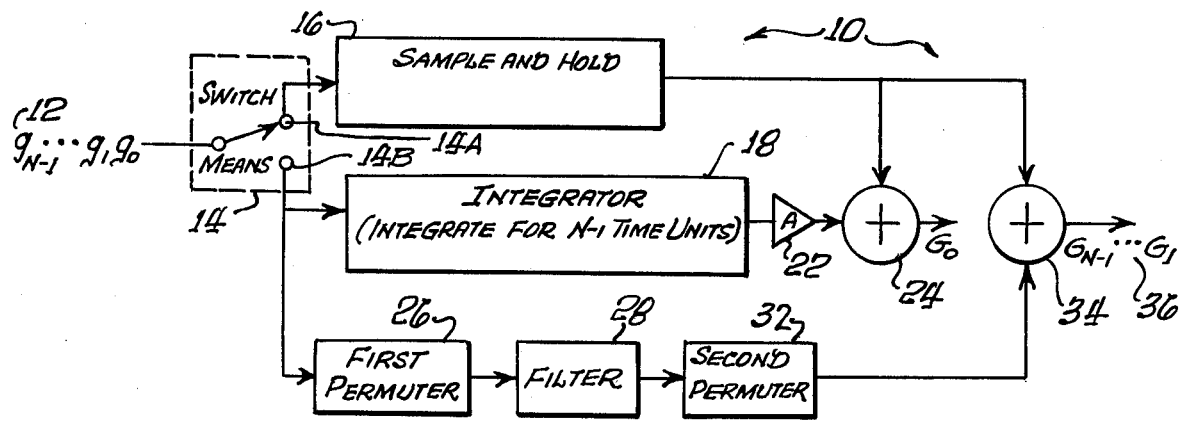
NOTE: THE SWITCH IS IN THE UP POSITION FOR THE FIRST DATA SAMPLE, AND IS DOWN FOR THE REMAINING N-1 SAMPLES.
Fig. 1. APPARATUS FOR PERFORMING A DISCRETE FOURIER OR ODD COSINE TRANSFORM.
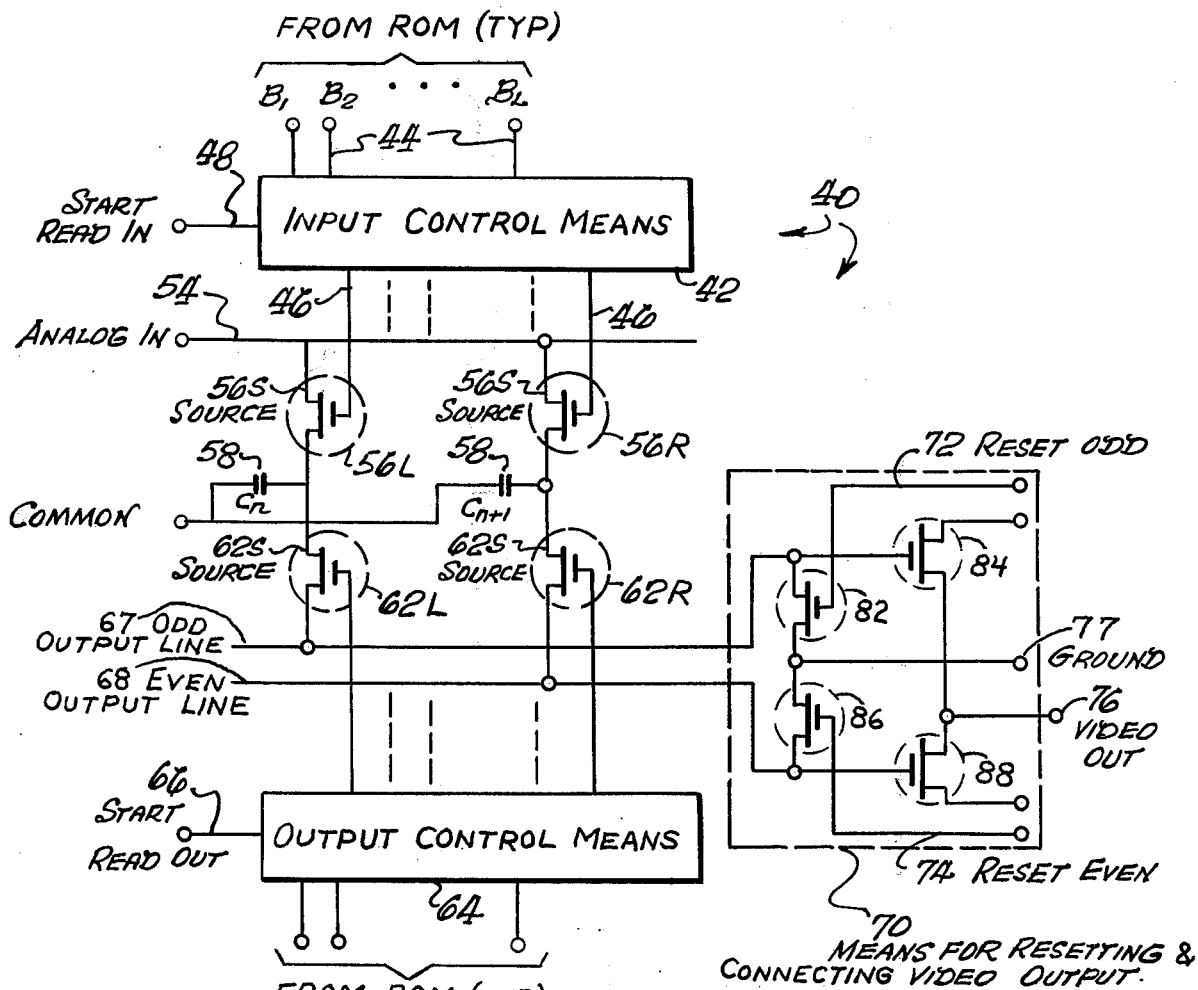
Fig. 2. ANALOG PERMUTATION MEMORY.

DISCRETE TRANSFORM SYSTEMS USING PERMUTER MEMORIES

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

This invention relates to high-speed, high-accuracy implementations of the discrete Fourier and discrete odd cosine transforms, suitable for signal processing applications such as sonar, radar, communication, beamforming, image data compression, etc.

Present analog high-speed transform implementations are largely based on the chirp-Z transform architecture, and require a premultiplication, a convolution, and a postmultiplication. The two most useful filter technologies for the convolution are surface wave devices and charge transfer devices. When surface acoustic wave devices are used, balanced mixers are generally used as the multipliers, and the mixers limit the attainable transform accuracy. When charge transfer devices are used as the filters, baseband multipliers are required. At present it is necessary to build these multipliers as discrete components, off the charge-coupled device (CCD) chip. The multipliers prevent the fabrication of the transform device as a single, large-scale integrated (LSI) chip and contribute greatly to the cost of the transform system, as well as limiting the transform accuracy.

In the implementation of the odd discrete cosine transform, each permuter need permute only one real sequence, and each filter only need be one real filter.

This is distinct from the Fourier transform case where there is complex input data present, as well as a complex transform kernel.

This makes a prime cosine transform implementation much simpler than a chirp-Z cosine transform implementation, since the latter uses four real multipliers and four real filters.

SUMMARY OF THE INVENTION

The invention relates to apparatus for taking the discrete transform, which may be either the Fourier or the odd cosine transform, of a sampled analog input signal, consisting of N data samples, $g_0, g_1, \ldots, g_{N-1}$.

The apparatus comprises means, connected to the input signal, for connecting the input signal to either of two connections. Means are connected to one of the connections of the connecting means, for sampling the first data sampler, $g_0$, and holding it for N time units, $2 \leq N \leq 256$, a time unit being one inter tap delay, which may be as short as 0.2 microseconds, with present CCD transversal filters. Means are connected to the other connection of the connecting means, for integrating the input signal, excluding the $g_0$ sample, for N-1 time units.

Means, whose input is connected to the output of the integrating means, amplify the integrated signal. A first means, whose two inputs are connected to the outputs of the means for sampling and holding and of the amplifying means, sums its two input signals, the output signal being $G_0$, which is proportional to the direct-current component of the input signal, $g_0, \ldots, g_{N-1}$.

A first means is connected to the other connection of the connecting means, for performing a permutation on its input signal. Means, whose input is connected to the output of the fist permuting means, filters the permuted signal. A second means, whose input is connected to the output of the filtering means, permutes its input signal. A second means, having inputs connected to the outputs of the sampling and holding means and of the second permuting means, has an output which comprises the transformed terms $G_1, \ldots, G_{N-1}$.

STATEMENT OF THE OBJECTS OF THE INVENTION

An object of the invention is to provide apparatus which can perform a prime Fourier transform or a prime cosine transform on an input signal.

Another object of the invention is to provide apparatus which eliminates the multipliers required in prior art implementations.

BRIEF DESCRIPTION OF THE DRAWINGS

FIG. 1 is a block diagram of apparatus capable of performing a prime discrete Fourier transform, or a prime odd discrete cosine transform (ODCT).

FIG. 2 is a block diagram of an analog permutation memory, of the type used in the embodiment shown in FIG. 1.

DESCRIPTION OF THE PREFERRED EMBODIMENT

Referring now to FIG. 1, this figure shows an apparatus 10 for taking the discrete transform of a sampled analog input signal 12 consisting of N data samples, $g_0, g_1, \ldots, g_{N-1}$.

Means 14 are connected to the input signal 12, for connecting the input signal to either of two connections, 14A or 14B.

Means 16 are connected to one of the connections 14A of the connecting means 14, for sampling the first data sample, $g_0$, and holding it for N time units, $2 \leq N \leq 256$, a time unit being one transversal filter intertap delay time. The limitation $N \leq 256$ is not a fundamental limitation; it results from the fact that present CCD transversal filters are limited to about 512 taps and a filter with 2N-3 taps is required to realize a prime transform of length N.

Means 18 are connected to the other connection 14B of the connecting means 14, for integrating the input signal 12, excluding the $g_0$ sample, for N-1 time units.

Means 22, whose input is connected to the output of the integrating means 18, amplify the integrated signal.

A first means 24, whose two inputs are connected to the outputs of the means for sampling and holding 16 and of the amplifying means 22, sums its two input signals, the output signal being $G_0$.

A first means 26, connected to the other connection 14B of the connecting means 14, performs a permutation on its input signal.

Means 28, whose input is connected to the output of the first permuting means 26, filter the permuted signal.

In the prior art, whether the data is real or not, generally a premultiplication by a complex chirp is required. Therefore, at the output of the premultiplier appears a complex function, which enters a complex filter, which generally comprises four real filters.

For the case of the prime transform, where the first step in the algorithm is not a multiplication, but a permutation, if the input data is real, after permutation it is still real. If the prime Fourier transform is being performed, (1) with a complex input signal four real filters are required, two to handle the real part of the signal and two to handle the imaginary part of the signal, whereas (2) with a real input signal, two filters are required. It is analogous to multiplying a real number by a complex number, which would require two real multipliers. If the prime cosine transform is performed where ordinarily the input data is real, with a real kernel for the transform, only one real filter is required.

A second means 32, whose input is connected to the output of the filtering means 32 permutes its input signal, and thereby forms a cross-correlated output in permuted order.

A second means 34, having inputs connected to the outputs of the sampling and holding means 16 and of the second permuting means 32, has an output 36 comprising the transformed terms $G_1, \ldots, G_{N-1}$.

If the purpose of apparatus 10 is to take the prime Fourier transform of a complex input signal 12, the means for sampling and holding 16 would be a complex means, and the means for integrating 18 would be a complex integrator comprising two real integrators, one each for the real and imaginary parts.

The means for amplifying 22 which is optional for the Fourier transform would be a complex amplifier (i.e., a pair of real amplifiers) having a gain of one. The first and second permuting means, 26 and 32, would be complex permuters, that is, comprise a real channel permuter and an imaginary channel permuter.

The means for filtering 28 would be a complex filter, and the two summing means, 24 and 34, would be complex summers. The complex means 28 for filtering would comprise four transversal filters and two summing means or three transversal filters and three summing means, as described in Bond et al, "Complex Filters, Convolvers and Multipliers", U.S. Pat. No. 3,926,367, dated Dec. 16, 1975.

On the other hand, if the apparatus 10 is to be capable of taking the prime odd discrete cosine transform (ODCT) of an input signal 12 which is real, the means for sampling and holding 16 would be a real means, and the means for integrating 18 would be a real integrator. In this case, the means 22 for amplifying is a real amplifier having a gain of two. The first and second permuting means 26 and 32, are real permuters; the means 28 for filtering is a real filter; and the two summing means 24 and 34, are real summers. The real means for filtering may comprise a single transversal filter.

Referring now to FIG. 2, this figure shows a permutation memory 40 comprising an input control means 42, having a plurality of inputs 44 for an L-bit binary number, $B_1, B_2 \ldots B_L$, and a plurality $2^L$ of outputs 46. The $B_n$ comprise an L-bit binary control word, controlling $2^L$ samples to be stored. In an embodiment actually built, the control word comprised six bits, controlling $2^6 = 64$ samples, the control word designating any of 64 addresses. Means 48, connected to the decoding means 42, initiate the read in of the L-bit number. The binary decoder 42 takes a binary word and puts an ON signal on one of the lines, a line which corresponds to the value of the binary word. The value may be designated as $$\sum_{k=1}^{L} B_k 2^{k-1}.$$

When the line is turned on, the analog input channel is connected to only one of the capacitors, long enough to charge up the capacitor 58. All other switches 56 remain open, except the one charged up.

Means 54 are provided for applying an input signal, generally an analog signal. A first plurality $2^L$ of switching means 56 are connected to the $2^L$ outputs 46 of the decoding means 42 and to the signal applying means 54, each of the switching means being in a normally open condition. A plurality $2^L$ of means 58 are connected to the switching means 56, for storing a charge when a specific switching means, connected to a corresponding charge storing means 58, is in a closed condition. A second plurality $2^L$ of switching means 62 is connected to the first plurality of switching means 56 and to the charge storing means 58.

An output control means 64 is connected to the second plurality of switching means 62, for reading out the states of the $2^L$ charge-storing means 58, generally a capacitor, as to the charge on each.

Means 66 are connected to the output control means 64, for initiating the read out.

The input control means 42 and the output control means 64 may be a binary decoder and a shift register, respectively. Alternately, a shift register may be used as the input control means 42 and a binary decoder may be used as the output control means 64. Another alternative would be to use binary decoders for both means 42 and 64. The prior art uses shift registers for both means 42 and 64, and this permits only serial read-in and read-out, and cannot perform permutations.

If the read out uses a shift register 64, it is loaded with all zeroes except a single ONE. Normally, the non-zero ONE would be at the left-hand position, and at successive clock times it would move to the right. The output line is connected to the first capacitor 58 during the first clock time. The next clock time, the one moves to the right in the shift register 64 and is connected to the next charged capacitor. Eventually, the output line 76 reads through all the capacitors, in a manner somewhat similar to a rotary switch.

Means 70 are connected to second plurality of switching means 62, for discharging the charge storing means 58.

The permutation memory 40 may further comprise means 70, connected to the second switching means 62, for resetting the means for decoding 42, so that the complete cycle, from read in to read out, may be processed again.

After each capacitor 58 has been read out, the signal is destroyed by shorting each capacitor to ground, through ground line 77. Lines, or buses, 67 and 68, are alternately being used as a line to the video output 76 and a line to ground 77.

The video output line 76 is connected to upper bus 67 half the time and to bus 68 the other time. The same is true of the ground line 77. One of the two buses, 67 or 68, is connected to the output 76, the other bus, 68 or 67, is connected to the ground line 77. Each capacitor 58 is used to charge an output line 67 or 68. After read out of each sample, it is necessary to discharge the corresponding lines 67 or 68 via the corresponding reset switch 72 or 74.

In the permutation memory 40 shown in FIG. 2, the means 70 for resetting comprises a pair of means, one means 72 for resetting those means for storing charges 58 which are associated with the odd-numbered bits, $B_1$, $B_3, \ldots$, of the L-bit binary number, and another means 74 for resetting those means for storing charges which are associated with the even-numbered bits, $B_2, B_4, \ldots$, of the L-bit binary number.

The permutation memory 40 may further comprise a means 76, connected to the second plurality of switching means 62, for obtaining the permuted output in video form.

In the permutation memory 40 the first and second switching means, 56 and 62, comprise first and second pluralities $2^L$ of field-effect transistors (FETs), respectively. The first plurality of FETs 56 have their gates connected to the outputs of the means for decoding 42, their sources 56S connected to the means 54 for applying an input signal, and their drains connected to the charge-storing means, 57 and 58, and to the sources 62S of the second plurality of FETs 62.

The second plurality of FETs 62 have their drains connected to the means for resetting 70 and their gates connected to the inputs to the read out means the output control means 64.

The upper left FET 56L allows the left capacitor 58, labeled $C_n$, to be charged by a signal on analog line 54. Similarly, the upper right FET 56R permits a capacitor 58, which is labeled $C_{n+1}$, to be charged at another time.

As the input control means 42 turns on various FET's, 56L and 56R, it causes various capacitors 58 to be charged by an analog input signal on lead 54, when the associated FET is turned on. When all desired capacitors 58 have been charged, the read out process may then begin, through output control means 64. This permits specific capacitors 58 to be connected to an output line, 67 or 68. An even numbered capacitor 58, $C_{n+1}$, may be connected by a corresponding FET 62R to the even output line 68, or an odd numbered capacitor $C_n$ may be connected by a corresponding FET 62L to the odd output line 67.

Either output line, 67 or 68, itself, has some capacitance. Therefore, after the associated output line is read by connecting it to the video output port 76, it is necessary to discharge it through reset control 72 or 74. One reset control 72 discharges the odd numbered capacitor $C_n$, through odd output line 67. The other reset control 74 is provided for discharging the even-numbered line 68.

Discussing now the timing of the processing of the data samples of the apparatus 10, in general, during N time units the data is being read into the first permuter 26. During the next N successive time units, filter 28 is being loaded. During another N time units, the data samples are read out of the filter 28, and read into the second permuter 32. Then another N time units are required to read the data out of the second permuter 32, so that it can be summed in summer 34.

Therefore, the sample and hold circuit 16 must hold the data samples 12, for 3N time units before discharging them into summer 34. Also, it takes a total of 4N time units for the data samples 12 to be processed by apparatus 10.

In a typical sample and hold circuit, such as 16, a charge is transferred to a capacitor and held on it until it is ready to be read out by discharging it.

The output signal 36, which is read out, is an analog signal, but could include, as a special case, digital signals. The capacitors 58 are not merely charged or not charged, but they may have a specific charge, which can be read out. The signals are analog signals throughout the apparatus 10, although the controls are digital. It is a digital control as to which capacitors 58 are connected to which bus lines, 67 or 68. However, the values of the charges on the capacitors 58 are analog, they can assume a continuum of values.

Discussing now the theory behind the invention, and beginning with very broad concepts, the equation $$G_k = \sum_{n=0}^{P-1} g_n f(nk) \tag{1}$$

defines a transform which may be implemented using permuter memories when the block length P is prime and $f$ is a function which is periodic, with period equal to P.

For the prime Fourier transform, $$f(x) = e^{-\frac{i2\pi x}{P}} \tag{2}$$

$$G_k = \sum_{n=0}^{P-1} g_n e^{-\frac{i2\pi nk}{P}} \tag{3}$$

where P is prime.

Each sample of the input signal 12 may consist of pulses obtained from sampling an analog signal. The pulses may be narrow or wide, even so wide as to touch each other. In any given signal, the pulses would generally have the same width. The signal 12 consists of a train of such samples. The term $g_o$ refers to the first input sample, whereas the output sample $G_o$, is proportional to the average of d-c value of the input sequence.

In the use of the prime Fourier transform, in general the input signal may be complex and the output signal may be complex.

The term "permuter" is, of course, derived from the term "permutation", which has the following connection to the invention: The powers of primitive roots are examined. These powers give every non-zero number modulo P. The powers do not necessarily occur in the sequence 1, 2, . . . , P-1, but may occur in some permutation of the sequence.

For example, if P=5 and R=2, then the powers of the primitive root $1^o, R, R^2, \ldots, R^{P-2}$, become 1, 2, 4, 8, which MOD P=5 equals 1, 2, 4, 3, a permutation of 1, 2, 3, 4. In general, all terms, 1, 2, . . . , P-1, would appear in the permutation, each term appearing exactly once.

This means that every one of the non-zero numbers can be represented as some power. So, for every n, n can be made equal to $R^{n'}$ mod P. It is to be noted that, $R^{P-1} = 1$. The range may be either from 0 to P-2, in the exponents, or from 1 to P-1, they are equivalent.

Examining the function $f(R^s)$, $f$ is a function of the integers mod P, but $R^s$ mod P will repeat periodically as soon as $s = P-1$. Therefore $f(R^s)$ has a period P-1 as a functon of s, as distinguished from the function $f(s)$, which has a period of P.

The sum $$\sum_{n'=1}^{P-1} g_{R^{n'}} f(R^{n'+s})$$

automatically becomes a cyclic cross-correlation.

From the above discussion, it follows that the structure 10 shown in FIG. 1, can serve to implement transforms of the type discussed. At present, the only two known useful transforms are the discrete prime Fourier transform (DFT) and the odd discrete cosine transform (ODCT).

Any equation for $G_k$ such as Eq. (1) can be implemented in the manner shown in FIG. 1. Exactly the same permutation orders are used as for implementing the Fourier transform, and the filter weights are the permuted version of the function $f$.

The prime transform reduces the transform computation to a cross-convolution, or a cross-correlation, of two complex sequences, the permuted data sequence and the appropriately permuted sinusoid.

Therefore, in FIG. 1, in detail, the filter 28 must be complex, it is accepting a complex input signal and convolving it with a complex function. The means for filtering 28 could be realized as four real filters, or as three real filters, as described in U.S. Pat. No. 3,926,367, entitled COMPLEX FILTERS, CONVOLVERS, AND MULTIPLIERS, By Jeffrey M. Speiser et al, which issued on Dec. 16, 1975.

The first and second permuters, 26 and 32, permute a complex sequence, and each consists of a real channel permuter and an imaginary channel permuter. For the discrete Fourier transform, the prime P would equal the data block length, N.

Discussing now the theory behind the invention as it relates to the odd discrete cosine transform (ODCT), in this case, $f(nk)$ in Equation (3) is equal $$\text{to } \cos \frac{2\pi nk}{2N-1}, \text{ and the prime } P = 2N - 1. \quad (4)$$

The cosine transform is usually used with image data, which are real. As a result, the required permutation is a permutation of real data, the required convolution is a convolution of real data, and the final permutation is a permutation of real data. For the purpose of transmitting compressed data over a channel with limited bandwidth, the second permutation may be omitted from the transform device. This holds true for any application which does not require access to the transform values in their normal order.

For many purposes, a single permuter memory is itself a useful device. For example, in data transmission through channels with burst errors, reordering the data is useful, because instead of all errors appearing in a bunch, they are now spread out throughout the data, and some error-correcting codes can now compensate for the errors, so that the data is now useful. This process is termed "interleaving" in the coding literature.

The high speed implementation, 10 in FIG. 1, of the odd discrete cosine transform eliminates the multipliers required in earlier implementations discussed in the prior art, based on the chirp-Z transform. The discrete cosine transform (DCT) is useful for television data compression since its basis vectors closely approximate those of the optimum Karhunen-Loeve transform for exponentially correlated data, as has been shown in the prior art. (R. W. Means, H. J. Whitehouse, and J. M. Speiser, "Television Encoding Using A Hybrid Discrete Cosine Transform and a Differential Pulse Code Modulation in Real Time", National Telecommunication Conference, 1974 Record, P.P. 61-66).

The odd discrete cosine transform is defined as the first N Fournier coefficients of the length 2N-1 even extension of the data, assuming that the data consists of N real values. This is shown in Equation (5):

$$G_k = \sum_{n=-(N-1)}^{N-1} g_n e^{-\frac{j2\pi kn}{(2N-1)}} \text{ for } k = 0,1,...N-1 \quad (5)$$

where $g_{-n} = g_n$.

An alternative way of writing Equation (5) is:

$$G_k = g_o + \sum_{\substack{m=-(N-1) \\ m \neq 0}}^{N-1} g_m e^{-\frac{j2\pi kn}{2N-1}} \quad (6)$$

The reason that the $g_o$ term is taken out is that it is advantageous to change the product nk of the transform kernel $f(nk)$, of Esq. (1) and (3), into a sum, making use of powers of a primitive root. A zero is never obtained as a power of a primitive root.

In order to be able to use a variant of Rader's Prime Transform Algorithm it may be assumed that P= 2N-1 is a prime. Note that the data block length, N, need not be a prime, as shown in Table 1. This algorithm is described by C. Rader, "Discrete Fourier Transforms When the Number of Data Samples is Prime", Proc. IEEE, Vol. 56, P. 1107-1108, 1968.

Table 1

| Selected Primes and the Corresponding OCDT Lengths and Filter Lengths | | |
|---|---|---|
| P (prime) | N = (P + 1)/2 (data block length) | 2N = 3 = P - 2 = filter length |
| 31 | 16 | 29 |
| 61 | 31 | 59 |
| 127 | 64 | 125 |
| 251 | 126 | 249 |
| 257 | 129 | 255 |

Note:
The filter lengths shown assume that the data is not recirculated or reread into the filter.

It has been shown in theory that if P is a prime, the discrete Fourier transform (DFT) of length P can be implemented using a circular convolution of length P-1 together with two analog permuter memories of length P. For more details on this implementation, reference is directed to the article by Whitehouse, H. J., Means, R. W., and Speiser, J. M., entitled "Signal Processing Architectures Using Transversal Filter Technology", which appeared in the Proceedings of the 1975 IEEE International Symposium on Circuits and Systems, Boston, Apr.21 - 23, 1975, Paper SC.1. It will be shown herein that the symmetry of the extended data in Eq. (1) permits the size of the circular convolution and the permuter memories to be reduced by a factor of two.

For each prime P, there is an integer R, called a primitive root of P, such that the residues of R, $R^2$, ... $R^{P-1}$ are all distinct modulo P, and include every nonzero residue modulo P. This is discussed by Gauss, C. F., "Disquisitiones Arithmeticae", Lipsiae, 1801. This is also available in the English translation by Arthur A. Clarke, Yale University Press, New Haven, 1966. See especially Pp. 37-40. Although primitive roots are also discussed in most modern textbooks on number theory, Gauss' original exposition remains unrivalled for clarity.

Therefore, for each integer n not congruent to zero mod P, $n$ can be represented uniquely as a power of R modulo P, say $m = R^{n'} \pmod P$. The integer $n'$ is called the index of $n$ (mod P) with respect to the primitive root R. In effect, R plays the role of the base of a system of logarithms in modulo P arithmetic, and $n'$ is the logarithm of n. This representation is useful because it allows us to replace multiplication by addition in the exponent of the DFT, and thus reduce the DFT to a circular correlation, as shown in equation (7).

$$G_{R^{k'}} = g_0 + \sum_{n' = -(N-2)}^{N-1} g_{R^{n'}} e^{-\frac{2\pi R^{n'} + k'}{2N-1}} \quad (7)$$

Since zero does not have an index (logarithm) with respect to the primitive root, the zero frequency point in the transform must be computed separately, as shown in equation (8).

$$G_0 = \sum_{n = -(N-1)}^{N-1} g_n = g_0 + 2 \sum_{n = 1}^{N-1} g_n \quad (8)$$

The interpretation of Eq. (7) is that the discrete Fourier Transform (DFT) coefficients in permuted order are obtained by adding $g_0$ to the circular cross-correlation of a permuted sinusoid with a permuted version of the data points excluding $g_0$. For the special case of the discrete cosine transform (DCT), the symmetry of the extended data allows us to replace the complex exponential by a cosine, as shown in equation (9).

$$G_{R^{k'}} = g_0 + \sum_{n' = -(N-2)}^{N-1} g_{R^{n'}} \cos\left(\frac{2\pi R^{k'} + n'}{(2N-1)}\right) \quad (9)$$

It will now be shown that the permuted data and the permuted cosine have periodicity N-1, so that the circular correlation of length P-1 = 2N-2 can be reduced to a circular correlation of length N-1. First it will be noted that both the extended data and the cosine function are even. Let $h_n$ be any even sequence. It will be shown that $h_{R^s}$ has period N-1, where the subscript $R^s$ is reduced modulo P = 2N-1.

It is well known in number theory that $R^{(P-1)/2} = -1$ (mod P). This is shown in the reference by Gauss. In the case under discussion, (P-1)/2 = (2N-2)/2 = N-1. Therefore $h_{R^s}+(N-1) = h_{R^s R^{N-1}} = h_{-R^s} = h_{R^s}$.

Using this periodicity property applied to Eq. (9) permits writing the odd discrete cosine transform in shorter form, as shown in Eq. (10).

$$G_{R^{k'}} = g_0 + 2 \sum_{n' = 1}^{N-1} g_{R^{n'}} \cos\left(\frac{2\pi R^{n'} + k'}{(2N-1)}\right) \quad (10A)$$

$$G_o = g_0 + 2 \sum_{n = 1}^{N-1} g_n \quad (10B)$$

The circular correlation required for Eq. (10A) may be implemented by any of the alternative methods using a transversal filter. The most straightforward would be to use a transversal filter of length 2(N-1)-1 = 2N-3, with tap weights of cos $(2\pi R^s/(2N-1))$, for $s = N-2, \ldots 1, 0, 1, 2 \ldots N-2$.

The architecture of the transform is shown in FIG. 1, and is virtually identical to that of the prime Fourier transform, except that the prime cosine transform need only permute real data and filter the permuted real data with a filter having real weights. The prime cosine transform is thus considerably simpler to implement than a prime Fourier transform of the same block length.

The analog permuter memory 40 shown in FIG. 2 has been developed as a modification of a commercially available serial analog memory. The commercially available serial-access memory stores analog samples as charges in an array of metal oxide semiconductor (MOS) capacitors under the control of read-in and read-out shift registers. The permuter memory shown in FIG. 2 differs in the fact that one of the shift registers has been replaced by a binary decoder 42, thus allowing the data to be reordered by an external control signal 54.

Obviously, many modifications and variations of the present invention are possible in the light of the above teachings, and, it is therefore understood that within the scope of the disclosed inventive concept, the invention may be practiced otherwise than as specifically described.

What is claimed is:

1. Apparatus for taking the discrete transform of a sampled analog input signal, consisting of N data samples, $g_0, g_1, \ldots$, comprising:

means, connected to the input signal, for connecting the input signal to either of two connections;

means, connected to one of the connections of the connecting means, for sampling the first data sample, $g_0$, and holding it for 3N time units, means, connected to the other connection of the connecting means, for integrating the input signal, excluding the $g_0$ sample, for N-1 time units;

means, whose input is connected to the output of the integrating means, for amplifying the integrated signal;

a first summing means, whose two inputs are connected to the outputs of the means for sampling and holding and of the amplifying means, for summing its two input signals, the output signal being $G_0$, the zero frequency term of the transform;

a first permuting means, connected to the said other connection of the connecting means, for performing a permutation on its input signal;

means, whose input is connected to the output of the first permuting means, for filtering the permuted signals; and second means, having inputs connected to the outputs of the sampling and holding means and of the filtering means, for summing its input signals, and whose output comprises the transformed terms $G_1, \ldots, G_{N-1}$.

2. The apparatus according to claim 1, further comprising:

a second permuting means, interconnected between the filtering means and the second summing means, for permuting its input signal.

3. The apparatus according to claim 1, for processing a complex input signal, wherein:

the means for sampling and holding is a complex means;

the means for integrating is a complex integrator, comprising two real integrators, one each for processing the real and imaginary parts of a complex input signal;

the amplifying means is a complex amplifier, comprising a pair of real amplifiers, having a gain of one;

the first and second permuting means are complex permuters, that is, comprise a real channel permuter and an imaginary channel permuter;

the means for filtering is a complex filter; and the two summing means are complex summers;

the apparatus thereby being capable of taking the prime discrete Fourier transform of a complex input signal.

4. The apparatus according to claim 3 wherein:

the complex means for filtering comprises:
two pairs of transversal filters, one pair for filtering the real part of a complex input signal and the other for filtering the imaginary part of the complex input signal; and
two real summers one connected to each of the pairs of summers.

5. The apparatus according to claim 3, wherein:
the complex means for filtering comprises:
three transversal filters; and
three summers, connected to the three filters.

6. The apparatus according to claim 1, wherein:
the means for sampling and holding is a real means;
the means for integrating is a real integrator;
the means for amplifying is a real amplifier having a gain of two;
the first and second permuting means are real permuters;
the means for filtering is a real filter; and
the two summing means are real summers;
the apparatus thereby being capable of taking the odd discrete cosine transform (ODCT) of an input signal which is real.

7. The apparatus according to claim 6, wherein:
the real means for filtering comprises a transversal filter.

* * * * *